(12) United States Patent
Mauder et al.

(10) Patent No.: US 7,015,562 B2
(45) Date of Patent: *Mar. 21, 2006

(54) HIGH-VOLTAGE DIODE

(75) Inventors: Anton Mauder, Kolbermoor (DE); Alfred Porst, München (DE)

(73) Assignee: Infineon Technologies AG, Munich (DE)

( * ) Notice: Subject to any disclaimer, the term of this patent is extended or adjusted under 35 U.S.C. 154(b) by 76 days.

This patent is subject to a terminal disclaimer.

(21) Appl. No.: 10/391,844

(22) Filed: Mar. 18, 2003

(65) Prior Publication Data

US 2003/0197247 A1  Oct. 23, 2003

Related U.S. Application Data

(63) Continuation-in-part of application No. 10/331,928, filed on Dec. 30, 2002, which is a continuation of application No. PCT/DE01/02366, filed on Jun. 27, 2001, now Pat. No. 6,888,211.

(30) Foreign Application Priority Data

Jun. 28, 2000  (DE) ................ 100 31 461

(51) Int. Cl.
*H01L 29/00* (2006.01)
(52) U.S. Cl. .................... 257/502; 438/549
(58) Field of Classification Search ............ 257/502, 257/514, 519, 527, 549, 656; 438/549
See application file for complete search history.

(56) References Cited

U.S. PATENT DOCUMENTS 6,888,211 B1 * 5/2005 Mauder et al. ............ 257/502
2003/0122151 A1 * 7/2003 Mauder et al. ............ 257/161

* cited by examiner

*Primary Examiner*—Wael Fahmy
*Assistant Examiner*—Ginette Peralta
(74) *Attorney, Agent, or Firm*—Laurence A. Greenberg; Werner H. Stemer; Ralph E. Locher

(57) ABSTRACT

A high-voltage diode has a dopant concentration of an anode region and a cathode region optimized in terms of basic functions static blocking and conductivity. Dopant concentrations range from $1\times10^{17}$ to $3\times10^{18}$ dopant atoms per $cm^3$ for the anode emitter, especially on its surface $10^{19}$ dopant atoms per $cm^3$ or more for the cathode emitter and approximately $10^{16}$ dopant atoms per $cm^3$ for the blocking function of an anode-side zone.

11 Claims, 1 Drawing Sheet

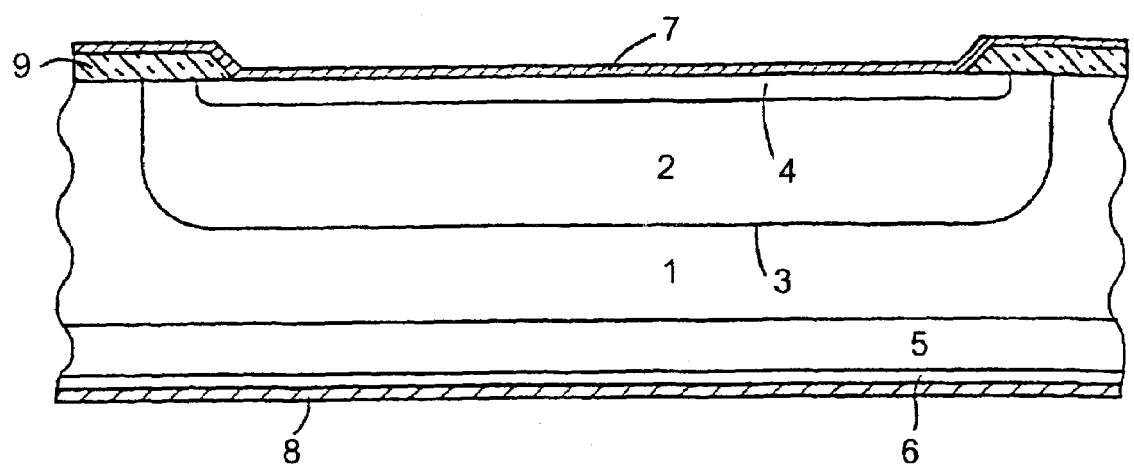

HIGH-VOLTAGE DIODE

CROSS-REFERENCE TO RELATED APPLICATIONS

This continuation-in-part application claims the benefit of U.S. application Ser. No. 10/331,928, filed Dec. 30, 2002 Now U.S. Pat. No. 6,888,211, which was a continuation of application No. PCT/DE01/02366, filed Jun. 27, 2001.

BACKGROUND OF THE INVENTION

Field of the Invention

The present invention relates to a high-voltage diode having an anodal p-conducting zone, a cathodal $n^-$-conducting drift zone, which forms a pn junction with the p-conducting zone, a $p^+$-conducting anode emitter, which adjoins an anode metalization layer and is provided in the p-conducting zone, and an $n^+$-conducting cathode emitter adjoining a cathode metalization layer.

In the case of fast high-voltage diodes of the type mentioned above, that is to say in the case of diodes with a $pn^-n$ structure, the efficiency of the anode emitter should be as low as possible in order to achieve an adjustable small flooding of the $n^-$-conducting drift zone with charge carriers at the anodal end thereof and thus a small peak reverse current during commutation of the high-voltage diode.

The setting of the efficiency of the anode emitter to relatively low values is currently achieved by employing irradiation techniques or by generally reducing the p-type dose introduced into the p-conducting zone. When employing irradiation techniques, however, the crystal damage inevitably induced thereby results in a rise in the reverse current level of the high-voltage diode, while limits are imposed on a reduction through minimization of the p-type dose insofar as an excessively low p-type dose does not ensure adequate contact connection and reduces the commutation strength as well as the static blocking capability of the high-voltage diode.

SUMMARY OF THE INVENTION

It is accordingly an object of the invention to provide a high-voltage diode that overcomes the above-mentioned disadvantages of the prior art devices of this general type, which is distinguished by the low efficiency of the anode emitter yet exhibits neither an increased reverse current level nor impairments with regard to a contact connection and commutation strength.

With the foregoing and other objects in view there is provided, in accordance with the invention, a high-voltage diode. The diode contains an anodal p-conducting zone being doped with a dose of $1.3-6\times10^{12}$ dopant atoms $cm^{-2}$, a cathodal $n^-$-conducting drift zone forming a pn junction with the anodal p-conducting zone, and a $p^+$-conducting anode emitter disposed in the anodal p-conducting zone. The anodal p-conducting zone is lighter doped than the $p^+$-conducting anode emitter. The p+-conducting anode emitter has a relatively high surface concentration doping with only a small penetration depth. The $p^+$-conducting anode emitter has a dopant dose lying between $5\times10^{12}$ dopant atoms $cm^{-2}$ and $2\times10^{13}$ dopant atoms $cm^{-2}$. An anode metallization layer adjoins the p+-conducting anode emitter. A cathode metallization layer is provided. An $n^+$-conducting cathode emitter adjoins the cathode metallization layer. An n-conducting zone is disposed between the cathodal $n^-$-conducting drift zone and the $n^+$-conducting cathode emitter.

In one development of the invention, it is provided that the dopant dose of the $p^+$-conducting anode emitter lies between $5\times10^{12}$ dopant atoms $cm^{-2}$ and $2\times10^{13}$ dopant atoms $cm^{-2}$.

The doping concentration of the $n^+$-conducting cathode emitter is preferably above $10^{19}$ dopant atoms $cm^{-3}$ at the surface. Furthermore, the p-conducting zone adjoining the pn junction, which zone may preferably be implanted with a dose of about $(1.3 \ldots 1.8)\times10^{12}$ dopant atoms $cm^{-2}$, is diffused out with a diffusion width of about 2 μm. The doping concentration of the dopant atoms diffused out is then about $10^{16}$ dopant atoms $cm^{-3}$. It goes without saying, however, that a diffusion can also be employed instead of an implantation for the production of the p-conducting zone.

The $p^+$-conducting anode emitter is preferably implanted with a dose of at most $2\times10^{13}$ dopant atoms $cm^{-2}$.

In addition, the emitter efficiency of the cathode emitter and/or of the anode emitter may be reduced by crystal damage near the surface. The crystal damage may be reduced by irradiation or ion implantation. In particular, argon or krypton may be used for such irradiation or ion implantation.

The high-voltage diode according to the invention or its dimensioning specifications indicated above for the doping concentration, in particular, are based on the consideration of achieving the essential basic functions of a diode, namely "static blocking" and "on state", by structures that are optimized in a targeted manner and are adapted in each case therefore in a semiconductor body or a chip. These basic functions will be explained in more detail further below specifically for the anode side. Equivalent considerations apply to the cathode side. The same also applies, of course, to a common realization of the basic functions on the anode side and the cathode side.

The following considerations apply to the "static blocking" function. If an avalanche breakdown occurs at a pn junction, physical dictates mean that the highest possible reverse voltage is present across the chip containing the pn junction with a p-conducting region and an n-conducting region. As a result, in the chip, dopant atoms are ionized both in the p-conducting region and in the n-conducting region in accordance with the breakdown charge. In this case, the breakdown charge is linked to the breakdown voltage by Maxwell's second equation. For silicon, the breakdown charge is about $(1.3 \ldots 1.8)\times10^{12}$ dopant atoms $cm^{-2}$.

Therefore, a dose of about $1.8\times10^{12}$ dopant atoms $cm^{-2}$ can inherently be regarded as sufficient to prevent a static punch-through of an electric field in a chip composed of silicon to a metal contact applied to the chip.

Such low doses of $1.8\times10^{12}$ dopant atoms $cm^{-2}$ are preferably introduced by ion implantation into the chip. However, since even small particles or defects can reduce the field-stopping effect and thus lead to a blocking failure of the high-voltage diode, it is advantageous if the implanted dopant atoms are diffused out. In this case, the minimum diffusion width depends on the expected size of the defects.

Moreover, the implanted dose should be raised somewhat in order ultimately to ensure that a dose of $1.8\times10^{12}$ dopant atoms $cm^{-2}$ is still present throughout the regions considered, even taking account of the defects mentioned.

Given a diffusion width of 2 μm, for example, an average dopant concentration of about $10^{16}$ dopant atoms $cm^{-3}$ then results.

The method of operation and the production of a cathodal n-conducting field stop zone are described in International Patent Disclosure WO 99/01956.

The following considerations apply to the "on state" basic function. For a reliable ohmic contact of the anode metallization layer and of the cathode metallization layer at the anode emitter and at the cathode emitter, respectively, and low contact resistances, considerably higher surface dopant concentrations are necessary than are given above in connection with the "static blocking" basic function. Moreover, it must be taken into account that the requirement for a defined, low efficiency of the anode emitter is equivalent to the requirement for a low dopant dose.

Both aims, namely a low contact resistance and a low efficiency of the anode emitter, are simultaneously achieved by a shallow implantation near the surface. However, this implanted profile is permitted to be diffused out only to an extent such that concentrations of about $10^{17}$ dopant atoms $cm^{-3}$ for the p-conducting zone cannot be undershot under any circumstances at the surface of the chip. It is expedient, then, for the implanted dose of the anode emitter merely to be activated and diffused only slightly over a few nm.

For the "on state" basic function, small defects in the crystal lattice of the chip with dimensions of a few $\mu m$ do not play a crucial part since these defects do not noticeably alter the current-carrying area, which is preferably more than 1 $mm^2$. Moreover, the "static blocking" basic function does not need to be performed by the anode emitter.

Taking account of the above considerations, an expedient dose for the $p^+$-conducting anode emitter is found at values of at most about $2 \times 10^{13}$ dopant atoms $cm^{-2}$.

Corresponding considerations apply to the cathode emitter, even though no effects occur there on a peak reverse current.

As is known, the emitter efficiency of the cathode should be greater than the emitter efficiency of the anode (see the reference by A. Porst et al., titled "Improvement Of The Diode Characteristics Using Emitter Controlled Principles (EMCON-Diode)", Proc. ISPSD, Weimar, 1997, pp. 213–216), in order to achieve a greater increase in charge carriers on the cathode side. If this is taken into account, then it is possible to achieve a targeted coordination of the recovery behavior, for example a "soft recovery behavior" of a high-voltage diode for different applications.

Donor concentrations of above $10^{19}$ dopant atoms $cm^{-3}$ should be present at the surface of the cathode emitter in order to ensure an ohmic contact with the cathode metallization layer made, for example, of aluminum. An expedient dose for forming the cathode emitter then lies above $5 \times 10^{13}$ dopant atoms $cm^{-2}$.

In the case of the high-voltage diode according to the invention, the emitter efficiency of the respective contact layer, that is to say of the anode emitter or of the cathode emitter, can additionally be reduced by crystal damage near the surface. Such crystal damage can be produced by instances of irradiation or ion implantation using argon or krypton, for example. As a result, however, there is no need to fear that the blocking properties of the high-voltage diode will be impaired.

In comparison with the soft recovery diode known from Published, Non-Prosecuted German Patent Application DE 195 43 922 A1, the high-voltage diode according to the invention is distinguished specifically by the now described properties.

The invention indicates dimensioning specifications for the p-conducting field stop zone and the required doping thereof and the contact implantation at the anode and the cathode.

The dose of the p-type contact implantation formed by the $p^+$-conducting anode emitter need not be higher than the dose of the implantation which forms the p-conducting field stop zone and which should have a dose of at least $1.8 \times 10^{12}$ dopant atoms $cm^{-2}$. It may, however, have a higher dose, which, however, should preferably not be higher than $2 \times 10^{13}$ dopant atoms $cm^{-2}$. The implantation should be annealed.

If appropriate, crystal damage can be produced at the surface, for example by ion implantation using heavy, non-doping ions, such as e.g. argon.

The cathode preferably has a higher contact implantation dose than the anode.

The high-voltage diode according to the invention is relatively simple to produce and requires no additional photoplanes. Rather, the photoplanes and maskings that are employed in existing diodes are sufficient.

Other features which are considered as characteristic for the invention are set forth in the appended claims.

Although the invention is illustrated and described herein as embodied in a high-voltage diode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a diagrammatic, sectional view of an exemplary embodiment of a high-voltage diode according to the invention.

DESCRIPTION OF THE PREFERRED EMBODIMENTS

Referring now to the single FIGURE of the drawing in detail, there is shown a high-voltage diode according to an exemplary embodiment of the invention and contains a silicon body. Instead of silicon, it is also possible to choose another suitable semiconductor material, such as, for example, SiC etc. In this case, implantation doses must be adapted to the respective material. The silicon body has an $n^-$-conducting drift zone 1, a p-conducting zone 2, which forms a pn junction 3 with the $n^-$-conducting drift zone, a $p^+$-conducting anode emitter 4, an n-conducting zone 5 and an $n^+$-conducting cathode emitter 6.

The anode emitter 4 is provided with an anode metallization layer 7, and a cathode metallization layer 8 is applied on the cathode emitter 6. Known contact materials such as, for example, Al, AlSi etc. can be chosen for the metallization layers 7, 8.

The doping concentration in the $p^+$-conducting anode emitter 4 is set between $1.5 \times 10^{12} \ldots 5 \times 10^{13}$ atoms $cm^{-2}$. The dose preferably lies between $5 \times 10^{12} \ldots 2 \times 10^{13}$ atoms $cm^{-2}$. The anode emitter 4 is preferably produced by a shallow implantation near the surface, followed by an annealing with no significant outward diffusion of the profile implanted in this way. The outward diffusion should take place only to an extent such that the values indicated further above for the surface doping concentrations are not undershot under any circumstances. In other words, surface concentrations for the anode emitter of less than $1 \times 10^{17}$ dopant atoms $cm^{-3}$ should not be set.

It is expedient for the dose implanted in this way merely to be activated and, in the process, diffused out only slightly by a few nm.

The p-conducting zone 2 may preferably be implanted with a dose of $1.3 \times 10^{12}$ to $1.8 \times 10^{12}$ dopant atoms $cm^{-2}$ and diffused out with a diffusion width of about 2 $\mu$m. The low dose suffices to achieve the desired field-stopping effect for the p-conducting zone 2. If appropriate, it is also possible to use values somewhat higher than $1.8 \times 10^{12}$ dopant atoms $cm^{-2}$, this being applicable particularly when small particles or defects are present in the zone 2. Thus, values of preferably $1.5 \times 10^{12}$ to $6 \times 10^{12}$ dopant atoms $cm^{-2}$ are expedient.

Given the indicated diffusion width of 2 $\mu$m, an average doping concentration in the zone 2 of about $10^{16}$ atoms $cm^{-3}$ results.

The cathode emitter 6 should have a likewise adjustable, but higher emitter efficiency than the anode emitter 4, in order thus to achieve a greater targeted increase in charge carriers on the cathode side. Thus, donor concentrations of above $10^{19}$ atoms $cm^{-3}$ are preferably set at the surface of the cathode emitter 6 in order to ensure an ohmic contact with the cathode metallization layer 8 made, for example, of aluminum. An expedient dose for the implantation of the cathode emitter is found at values of $5 \times 10^{13}$ dopant atoms $cm^{-2}$ or greater.

The emitter efficiency in the anode emitter 2 or in the cathode emitter 6 can be reduced further by crystal damage near the surface. Such crystal damage can be achieved by instances of irradiation or ion implantation using, for example, argon or krypton or the like. It is not expected that the targeted crystal damage near the surface will result in impairment of the blocking properties of the high-voltage diode since the layers of the zones 2 and 5 that are responsible for the static blocking are not affected.

The high-voltage diode according to the invention is provided with insulating layers in a customary manner, as is described for example in European Patent EP 0 341 453 B1, corresponding to U.S. Pat. No. 4,954,868. As an example of the beginning of a possible edge termination, an insulating layer 9 made of silicon dioxide on the anode side is shown in the exemplary embodiment. Instead of silicon dioxide, it is also possible to choose another suitable insulating material, such as silicon nitride, for example.

We claim:

1. A high-voltage diode, comprising:
   an anodal p-conducting zone being doped with a dose of $1.3$–$6 \times 10^{12}$ dopant atoms $cm^{-2}$;
   a cathodal $n^-$-conducting drift zone forming a pn junction with said anodal p-conducting zone;
   a $p^+$-conducting anode emitter disposed in said anodal p-conducting zone, said anodal p-conducting zone being lighter doped than said $p^+$-conducting anode emitter, said p+-conducting anode emitter having a relatively high surface concentration doping with only a small penetration depth, said $p^+$-conducting anode emitter having a dopant dose lying between $5 \times 10^{12}$ dopant atoms $cm^{-2}$ and $2 \times 10^{13}$ dopant atoms $cm^{-2}$;
   an anode metallization layer adjoining said p+-conducting anode emitter;
   a cathode metallization layer;
   an $n^+$-conducting cathode emitter adjoining said cathode metallization layer; and
   an n-conducting zone disposed between said cathodal $n^-$-conducting drift zone and said $n^+$-conducting cathode emitter.

2. The high-voltage diode according to claim 1, wherein said $n^+$-conducting cathode emitter having surface and a doping concentration above $10^{19}$ dopant atoms $cm^{-3}$ at said surface.

3. The high-voltage diode according to claim 1, wherein said anodal p-conducting zone has implanted dopant atoms that diffused out with a diffusion width of about 2 $\mu$m.

4. The high-voltage diode according to claim 1, wherein said $p^+$-conducting anode emitter is implanted with a dose of at most $2 \times 10^{13}$ dopant atoms $cm^{-2}$.

5. The high-voltage diode according to claim 1, wherein at least one of said $n^+$-conducting cathode emitter and said p-conducting anode emitter has a surface with crystal damage near said surface for reducing emitter efficiency.

6. The high-voltage diode according to claim 5, wherein said crystal damage is produced by one of irradiation and ion implantation.

7. The high-voltage diode according to claim 6, wherein argon or krypton is used for the irradiation or the ion implantation.

8. A method for producing a high-voltage diode having an anodal p-conducting zone, a cathodal $n^-$-conducting drift zone forming a pn junction with the anodal p-conducting zone, a $p^+$-conducting anode emitter disposed in the anodal p-conducting zone, an anode metallization layer adjoining said p+-conducting anode emitter, an $n^+$-conducting cathode emitter, a cathode metallization layer adjoining the n+-conducting cathode emitter, and an n-conducting zone disposed between the cathodal $n^-$-conducting drift zone and the $n^+$-conducting cathode emitter, the method which comprises the steps of:
   implanting the anodal p-conducting zone adjoining the pn junction with a dose of $1.3$–$6 \times 10^{12}$ dopant atoms $cm^{-2}$ and implanted dopant atoms of the anodal p-conducting zone being diffused out with a diffusion width of about 2 $\mu$m;
   implanting the $p^+$-conducting anode emitter with a dose of between $5 \times 10^{12}$ dopant atoms $cm^{-2}$ and $2 \times 10^{13}$ dopant atoms $cm^{-2}$, so that the anodal p-conducting zone being lighter doped than the $p^+$-conducting anode emitter, the p+-conducting anode emitter having a relatively high surface concentration doping with a shallow penetration depth; and
   implanting the $n^+$-conducting cathode emitter with dopant atoms having a dose such that a doping concentration of the $n^+$-conducting cathode emitter is above $10^{19}$ dopant atoms $cm^{-3}$ at a surface.

9. The method according to claim 8, which comprises implanting the $p^+$-conducting anode emitter with a dose of at most $2 \times 10^{13}$ dopant atoms $cm^{-2}$.

10. The method according to claim 8, which comprises producing crystal damage near a surface in at least one of the n+-conducting cathode emitter and the p+-conducting anode emitter by one of irradiation and ion implantation for reducing emitter efficiency.

11. The method according to claim 10, which comprises using one of argon and krypton for the irradiation or the ion implantation.

* * * * *